US006211538B1

(12) United States Patent
Park

(10) Patent No.: US 6,211,538 B1
(45) Date of Patent: Apr. 3, 2001

(54) ELECTROLUMINESCENT DEVICE INCLUDING A BLUE LIGHT EMITTING THICK-FILM ELECTROLUMINESCENT LAYER AND A RED LIGHT EMITTING THIN-FILM ELECTROLUMINESCENT LAYER

(75) Inventor: Yong Kuy Park, Pyungtaek-Si (KR)

(73) Assignee: Korea Institute of Industrial Tech., Chuncheongnam-Do (KR)

( * ) Notice: Subject to any disclaimer, the term of this patent is extended or adjusted under 35 U.S.C. 154(b) by 0 days.

(21) Appl. No.: 09/189,724

(22) Filed: Nov. 10, 1998

(51) Int. Cl.[7] ................................ H01L 33/00; H01J 1/62

(52) U.S. Cl. .............................. 257/88; 257/89; 257/103; 313/509

(58) Field of Search ................................. 257/88, 89, 91, 257/103, 79; 313/506, 503, 509

(56) References Cited

U.S. PATENT DOCUMENTS 4,801,844 1/1989 Barrow et al. ....................... 313/509
5,198,721 3/1993 Kahng et al. ........................ 313/503
5,598,059 1/1997 Sun et al. ............................ 313/509

*Primary Examiner*—Minh Loan Tran
(74) *Attorney, Agent, or Firm*—Rosenman & Colin, LLP

(57) ABSTRACT

An electroluminescent (EL) device for displaying a full color image includes a substrate, e.g., made of glass, a thick-film EL layered structure including a blue light emitting thick-film EL layer, e.g., made of ZnS:Cu and a thin-film EL layered structure including a red light emitting thin-film EL layer, e.g., made of CaS:Eu. In the EL device, the thick-film EL layered structure is formed on either top or bottom of the substrate and the thin-film EL layered structure is formed either on top of the thick-film EL layered structure or on top of the substrate. In the EL device, a green light emitting EL layer is included either in the thick-film EL layered structure as a green light emitting thick-film EL layer, e.g., made of ZnS:Tb or ZnS:Cu, or in the thin-film EL layered structure as a green light emitting thin-film EL layer, e.g., made of ZnS:Tb. The EL device is capable of providing a blue light, a green light and a red light concurrently, each light having a commercially acceptable brightness level to thereby, allowing the EL device to display a full-color image having a commercially acceptable brightness level.

20 Claims, 7 Drawing Sheets

ELECTROLUMINESCENT DEVICE INCLUDING A BLUE LIGHT EMITTING THICK-FILM ELECTROLUMINESCENT LAYER AND A RED LIGHT EMITTING THIN-FILM ELECTROLUMINESCENT LAYER

FIELD OF THE INVENTION

The present invention relates to an electroluminnescent device and a method for manufacturing thereof; and, more particularly, to a color electroluminnescent device and a method for manufacturing thereof.

BACKGROUND OF THE INVENTION

In recent years, elctroluminescent (EL) devices in both a thin-film EL type and a thick-film type have been suggested to display a multi-color image. Both of the thin-film and thick-film EL devices, however, are burdened with major shortcomings.

To be more specific, the thin-film EL device, while capable of providing a red light of a commercially acceptable brightness level, is incapable of providing the same for a blue light of a commercially acceptable brightness level, whereas the thick-film EL device, while capable of providing a blue light of a commercially acceptable brightness level, is incapable of providing the same for a red light of a commercially acceptable brightness level.

In other words, neither the thin-film EL device nor the thick-film EL device could provide the blue light and red lights of a commercially acceptable brightness level concurrently to thereby prevent the EL devices from displaying a full-color image of a commercially acceptable brightness level.

SUMMARY OF THE INVENTION

It is, therefore, a primary object of the present invention to provide an electroluminescent (EL) device and a method for manufacturing thereof capable of providing a blue light and a red light having a commercially acceptable brightness level.

It is another object of the present invention to provide an electroluminescent (EL) device and a method for manufacturing thereof capable of displaying a full-color image by generating a blue light, a green light and a red light, having a commercially acceptable brightness level.

In accordance with the present invention, there is provided an EL device comprising: a substrate; a thick-film electroluminescent (EL) layered structure formed on either on top or bottom of the substrate, the thick-film EL layered structure including a blue light emitting thick-film EL layer; a thin-film EL layered structure formed on either on top of the substrate or on top of the thick-film EL layered structure, the thin-film EL layered structure including a red light emitting thin-film EL layer; and a green light emitting EL layer to be included either in the thick-film EL layered structure as a green light emitting thick-film EL layer or in the thin-film EL layered structure as a green light emitting thin-film EL layer.

BRIEF DESCRIPTION OF THE DRAWINGS

The above and other objects and features of the present invention will become apparent from the following description of preferred embodiments given with reference to the accompanying drawings, in which.

DETAILED DESCRIPTION OF THE PREFERRED EMBODIMENTS

In accordance with a preferred embodiment of the present invention, an electroluminescent (EL) device includes a substrate; a thick-film EL layered structure formed on top of the substrate; and a thin-film EL layered structure formed on top of the thick-film EL layered structure.

In accordance with another preferred embodiment of the present invention, an EL device includes a substrate; a thick-film EL layered structure formed on bottom of the substrate; and a thin-film EL layered structure formed on top of the substrate.

In accordance with the present invention, the thick-film EL layered structure includes a blue light emitting thick-film EL layer; and the thin-film EL layered structure includes a red light emitting thin-film EL layer.

Further, in accordance with the present invention, a green light emitting EL layer is included either in the thick-film EL layered structure as a green light emitting thick-film EL layer or in the thin-film EL layered structure as a green light emitting thin-film EL layer.

Referring to FIGS. 1–4, there are shown schematic cross sectional views of full-color EL devices 100, 200, 300 and 400 having different structures in accordance with the preferred embodiment of the present invention. In FIGS. 1–4, arrows represent main paths of the light beams emitted from the corresponding EL layers, respectively.

Figure 1:
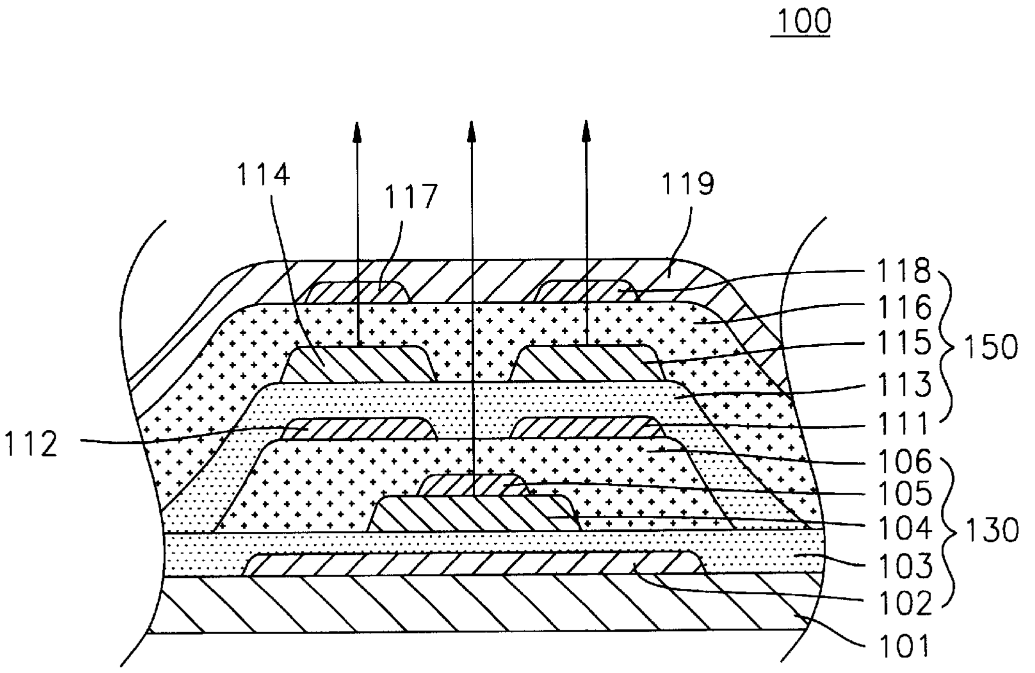
FIG. 1 represents a schematic cross sectional view of a full-color electroluminescent (EL) device in accordance with a first preferred embodiment of the present invention.

FIGS. 5A to 5F set forth schematic cross sectional views for illustrating a method for manufacturing the full-color EL device 100 shown in FIG. 1. FIGS. 6A to 6D offer schematic cross sectional views for illustrating a method for manufacturing the full-color EL device 200 represented in FIG. 2.

FIG. 1 represents a schematic cross sectional view of the full-color EL device 100 in accordance with a first preferred embodiment of the present invention. Referring to FIG. 1, the full-color EL device 100 includes a substrate 101 made of a transparent insulating material, e.g., glass; a thick-film EL layered structure 130 formed on top of the substrate 101, the thick-film EL layered structure 130 including a blue light emitting thick-film EL layer 104 to generate a blue light; and a thin-film EL layered structure 150 formed on top of the thick-film EL layered structure 130, the thin-film EL layered structure 150 including a red light emitting thin-film EL layer 115 to generate a red light.

In detail, the thick-film EL layered structure 130 includes a first electrode film 102 formed on top of the substrate 101; a first insulation film 103 formed on top of the first electrode film 102 and partially on top of the substrate 101; the blue light emitting thick-film EL layer 104 formed on top of the first insulation film 103; a second electrode film 105 formed on top of the blue light emitting thick-film EL layer 104; and a second insulation film 106 formed on top of the second electrode film 105, partially on top of the blue light emitting thick-film EL layer 104 and the first insulation film 103.

Figure 5A:
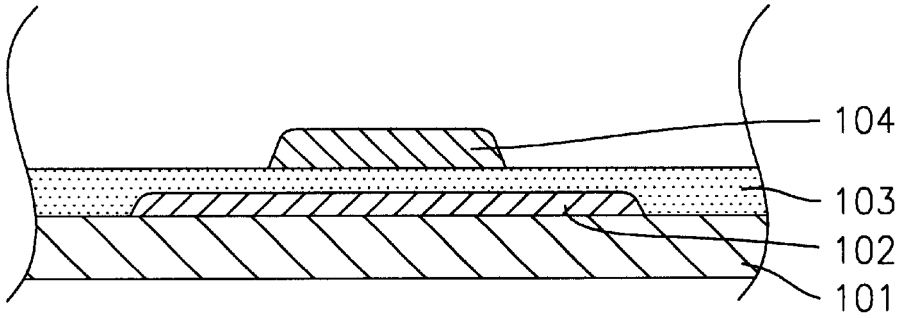
FIGS. 5A to 5F set forth schematic cross sectional views for illustrating a method for manufacturing the full-color EL device represented in FIG. 1.

As shown in FIG. 5A, the first electrode film 102 made of, e.g., silver (Ag), is formed by using, e.g., a screen printing method. The first insulation film 103 made of an insulating material, e.g., $BaTiO_3$, is formed by using either, e.g., a spray coating method or a screen printing method. The blue light emitting thick-film EL layer 104, e.g., made of ZnS:Cu, is formed by using a thick-film EL layer forming method, e.g., either a spray coating method or a screen printing method.

Figure 5B:
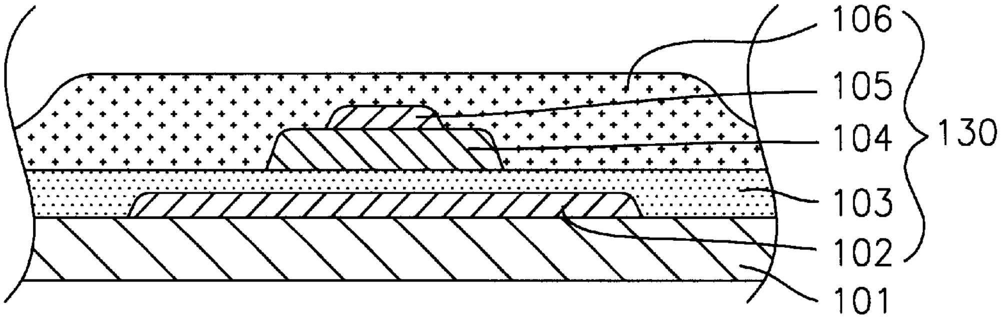

As shown in FIG. 5B, the second electrode film 105, e.g., made of either Aluminum (Al) or Indium Tin Oxide $In_2O_3$:$SnO_2$ (ITO), is formed by using, e.g., a sputtering method; and the second insulation film 106 made of an insulating material, e.g., $Y_2O_3$, is formed by using either, e.g., a sputtering method or an electron-beam evaporation method.

It should be noted that the center points of the first electrode film 102, the blue light emitting thick-film EL layer 104 and the second electrode film 105 are perpendicularly aligned.

The thin-film EL layered structure 150 includes a third electrode film 111 and a fourth electrode film 112, the third and fourth electrode film 111 and 112 being separated from each other and formed on top of the second insulation film 106; a third insulation film 113 formed on tops of the third and fourth electrode film's 111 and 112 and partially on top of the second insulation film 106; the red light emitting thin-film EL layer 115 and a green light emitting thin-film EL layer 114, the red light emitting thin-film EL layer 115 and the green light emitting thin-film EL layer 114 being separated from each other and formed on top of the third insulation film 113; a fourth insulation film 116 formed on tops of the green light emitting thin-film EL layer 114 and the red light emitting thin-film EL layer 115 and partially on top of the third insulation film 113.

The thin-film EL layered structure 150 further includes a fifth electrode film 117 and a sixth electrode film 118, the fifth and sixth electrode films 117 and 118 being separated from each other and formed on top of the fourth insulation film 116. It should be noted that the center points of the fourth electrode film 112, the green light emitting thin-film EL layer 114 and the fifth electrode film 117 are aligned perpendicularly; and the centers of the third electrode film 111, the red light emitting thin-film EL layer 115 and the sixth electrode film 118 are also perpendicularly aligned.

The third electrode film 111 and the fourth electrode film 112 are made of, e.g., ITO and formed by using, e.g., a sputtering method. The third insulation film 113 made of insulating material, e.g., $Y_2O_3$, is subsequently formed by employing, e.g., a sputtering method.

Figure 5C:
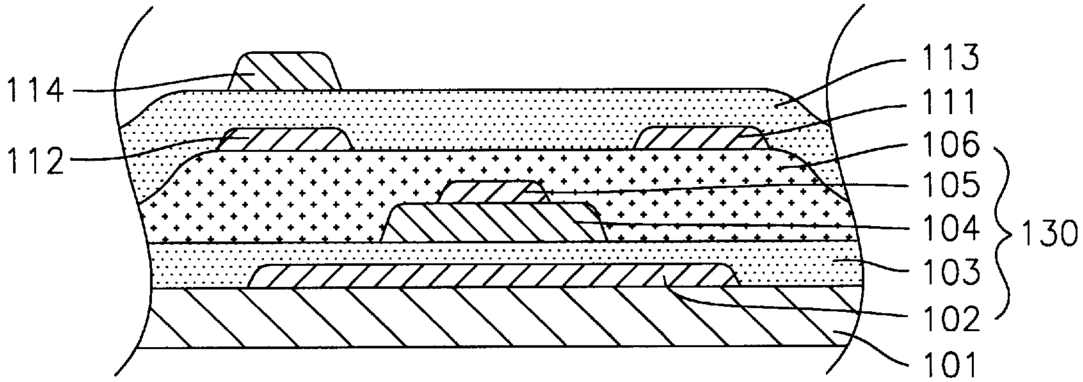
Figure 5D:
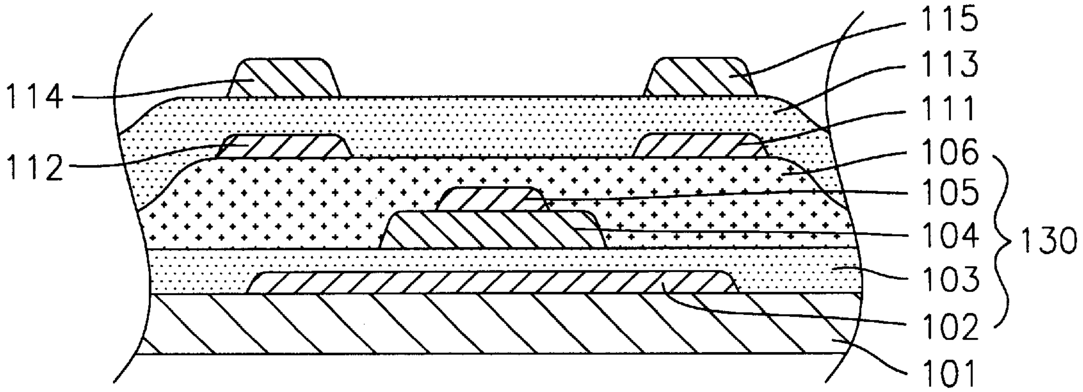
Figure 5E:
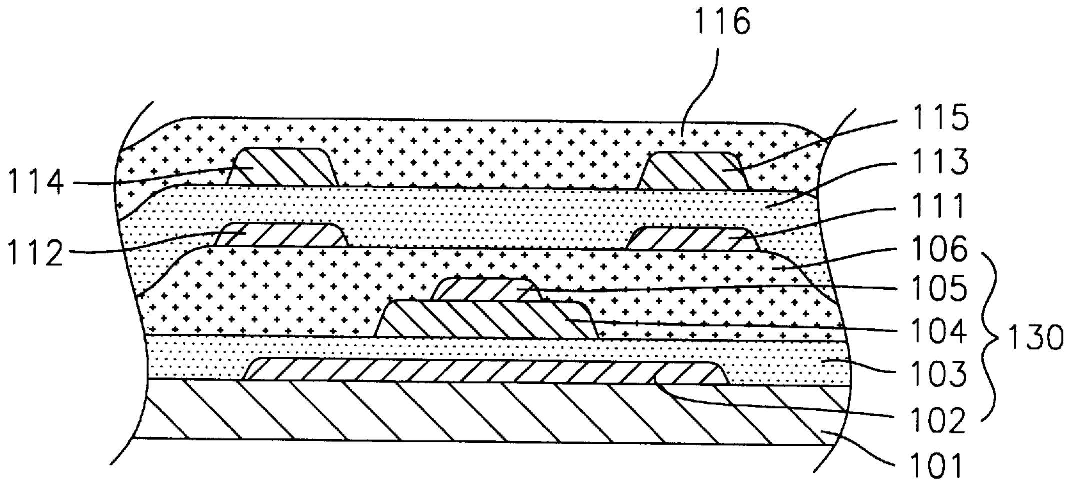
Figure 5F:
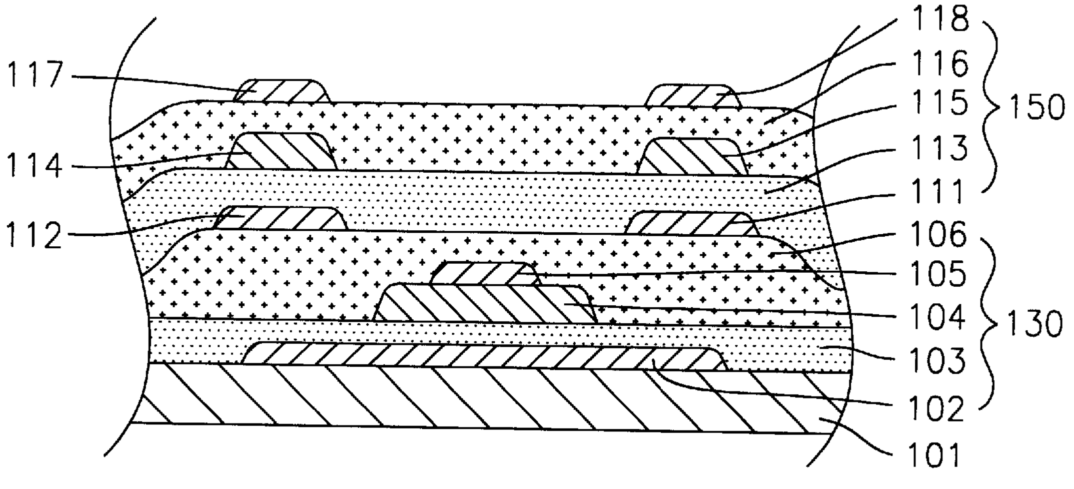

Thereafter, as shown in FIG. 5C, the green light emitting thin-film EL layer 114, e.g., made of ZnS:Tb, is formed on top of the third insulation film 113 by using a thin-film EL layer forming method, e.g., one of a sputtering method, an electron-beam evaporation method and an atomic layer epitaxy growth (ALE) method. As shown in FIG. 5D, the red light emitting thin-film EL layer 115, e.g., made of CaS:Cu, is formed on top of the third insulation film 113 by using a thin-film EL layer forming method.

As shown in FIG. SE, the fourth insulation film 116, e.g., made of $Y_2O_3$, is formed by using, e.g., a sputtering method.

Then, as shown in FIG. SF, the fifth electrode film 117 and the sixth electrode film 118 are made of, e.g., ITO and formed by using, e.g. a sputtering method.

In general, the thin-film EL layered structure 150 further includes a protection layer 119 made of a material which is resistant to water, a chemical attack and a physical impact from outside, e.g., parylene or glass. The protection layer 119 is formed on tops of the fifth electrode film 117 and the sixth electrode film 118 and partially on top of the fourth insulation film 116.

In accordance with a preferred embodiment of the present invention, the thickness of the substrate 101 ranges from about 0.8 mm to about 1.2 mm; the thickness of each of the first and second electrode films 102 and 105 ranges from about 0.8 $\mu$m to about 1.2 $\mu$m; the thickness of the blue light emitting thick-film EL layer 104 ranges from about 30 $\mu$m to about 40 $\mu$m; and the thickness of each of the first and second insulation films 103 and 106 ranges from about 5 $\mu$m to about 10 $\mu$m.

Further, the thickness of the third to sixth electrode films 111, 112, 117 and 118 range from about 0.3 $\mu$m to about 0.4 $\mu$m, respectively; the same for the thin-film EL layers 114 and 115 range from about 0.8 $\mu$m to about 1.0 $\mu$m, respectively; and the thickness of each of the third and fourth insulation films 113 and 116 ranges from about 0.2 $\mu$m to about 0.4 $\mu$m.

It should be also noted that the so-called conventional photolithography process including an etching technique is employed in forming the films or layers 111 to 118 included in the thin-film EL layered structure 150.

Figure 2:
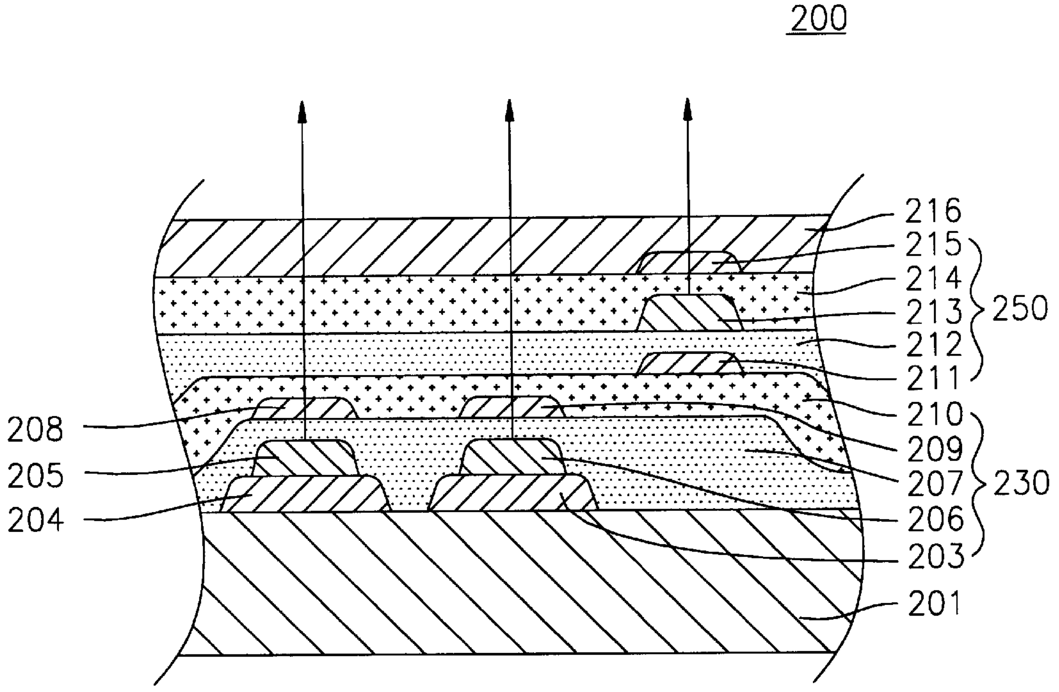
FIG. 2 presents a schematic cross sectional view of a full-color EL device in accordance with a second preferred embodiment of the present invention.

FIG. 2 presents a schematic cross sectional view of the full-color EL device 200 in accordance with a second preferred embodiment of the present invention.

Referring to FIG. 2, the full-color EL device 200 includes a substrate 201; a thick-film EL layered structure 230 formed on top of the substrate 201, the thick-film EL layered structure 230 including a blue light emitting thick-film EL layer 205 to generate a blue light and a green light emitting thick-film EL layer 206 to generate a green light; and a thin-film EL layered structure 250 formed on top of the thick-film EL layered structure 230, the thin-film EL layered structure 250 including a red light emitting thin-film EL layer 213 to generate a red light.

In detail, the thick-film EL layered structure 230 includes an 11th electrode film 203 and a 12th electrode film 204, the 11th and 12th electrode films 203 and 204 being separated from each other and formed on top of the substrate 201; the blue light emitting thick-film EL layer 205 formed on top of the 12th electrode film 204; a green light emitting thick-film EL layer 204 formed on top of the 11th electrode film 203; an 11th insulation film 207 formed partially on tops of the substrate 201, the 11th and 12th electrode films 203 and 204 and on tops of the blue light emitting thick-film EL layer 205 and the green light emitting thick-film EL layer 206.

The thick-film EL layered structure 230 further includes a 13th electrode film 208 and a 14th electrode film 209, the 13th and 14th electrode films 208 and 209 being separated from each other and formed on top of the 11th insulation film 207; and a 12th insulation film 210 formed on tops of the 13th and 14th electrode films 208 and 209 and partially on top of the 11th insulation film 207.

It should be noted that the center points of the 12th electrode film 204, the blue light emitting thick-film EL layer 205 and the 13th electrode film 208 are perpendicularly aligned; and the center points of the 11th electrode film 203, the green light emitting thick-film EL layer 206 and the 14th electrode film 209 are also perpendicularly aligned.

Figure 6A:
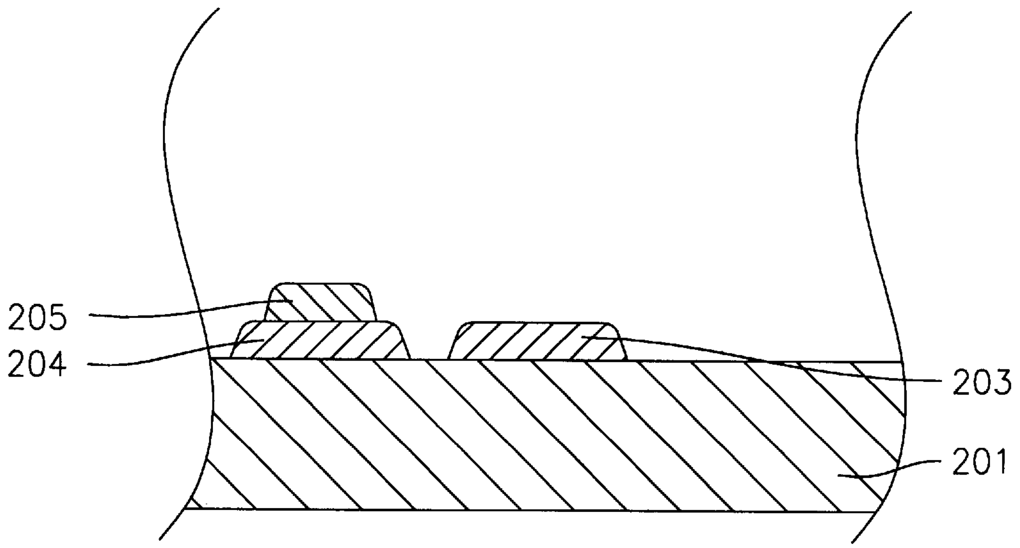
FIGS. 6A to 6D offer schematic cross sectional views for illustrating a method for manufacturing the full-color EL device presented in FIG. 2.

As depicted in FIG. 6A, each of the 11th electrode film 203, e.g., made of silver (Ag) and the 12th electrode film 204, e.g., made of Ag is formed on top of the substrate 201, e.g., made of glass by using, e.g., a screen printing method. The blue light emitting thick-film EL layer 205, e.g., made of ZnS:Cu is formed on top of the 12th electrode film 204 by using a thick-film EL layer forming method, e.g., a spray coating method or a screen printing method.

Figure 6B:
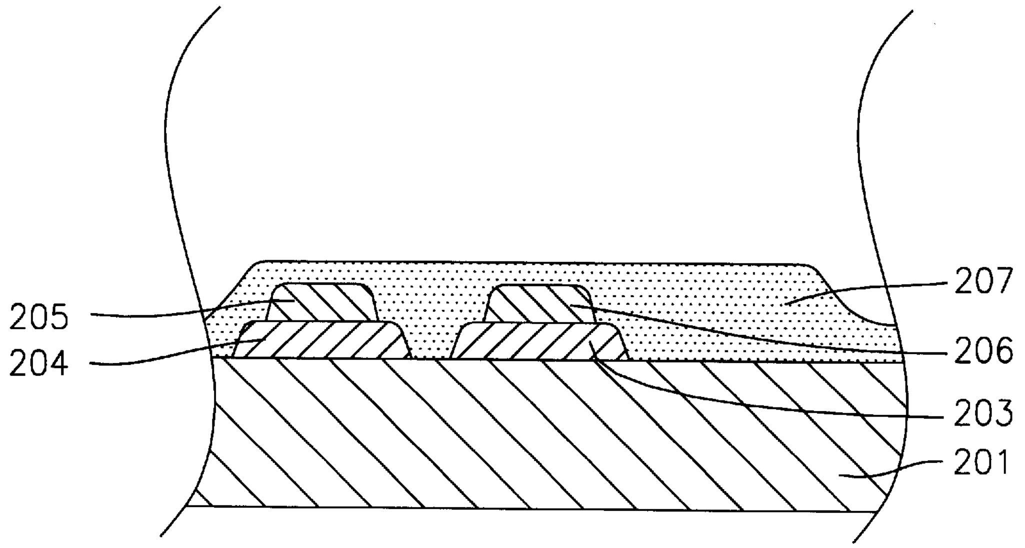

Thereafter, as represented in FIG. 6B, the green light emitting thick-film EL layer 206, e.g., made of one of ZnS:Tb, ZnS:Cu and ZnS:Mn is formed by using the thick-film EL layer forming method. The 11th insulation film 207, e.g., $Y_2O_3$ is formed by using, e.g., a sputtering method.

Figure 6C:
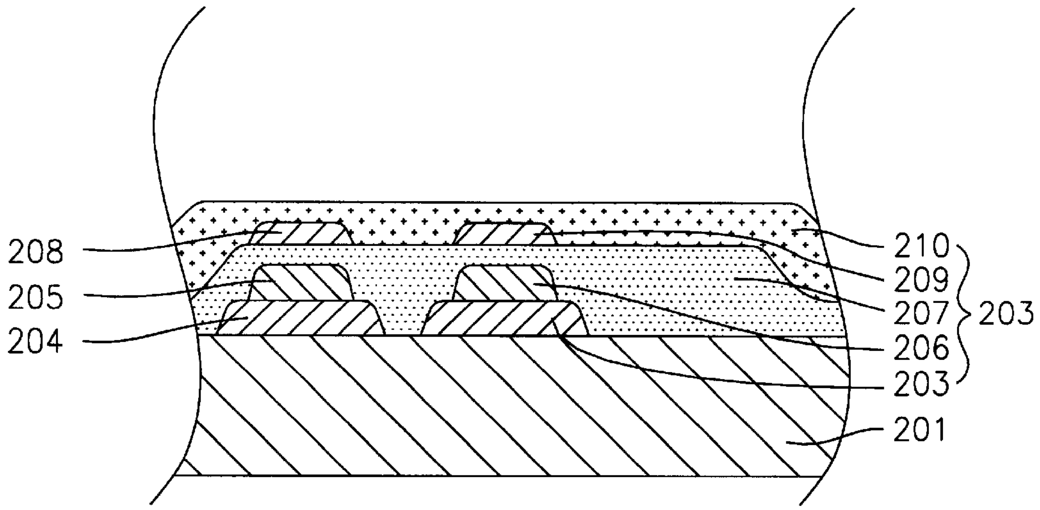

Next, as shown in FIG. 6C, each of the 13th electrode film 208, e.g., made of ITO and the 14th electrode film 209, e.g., made of ITO is formed by using, e.g., an electron-beam evaporation method. The 12th insulation film 210, e.g., made of $Y_2O_3$ is formed by using, e.g., a sputtering method.

The thin-film EL layered structure 250 includes a 15th electrode film 211 formed on top of the 12th insulation film 210; and a 13th insulation film 212 formed on top of the 15th electrode film 211 and partially on top of the 12th insulation film 210.

The thin-film EL layered structure 250 further includes the red light emitting thin-film EL layer 213 formed on top of the 13th insulation film 212; a 14th insulation film 214 formed on top of the red light emitting thin-film EL layer 213 and partially on top of the 13th insulation film 212; and a 16th electrode film 215 formed on top of the 14th insulation film 214.

Figure 6D:
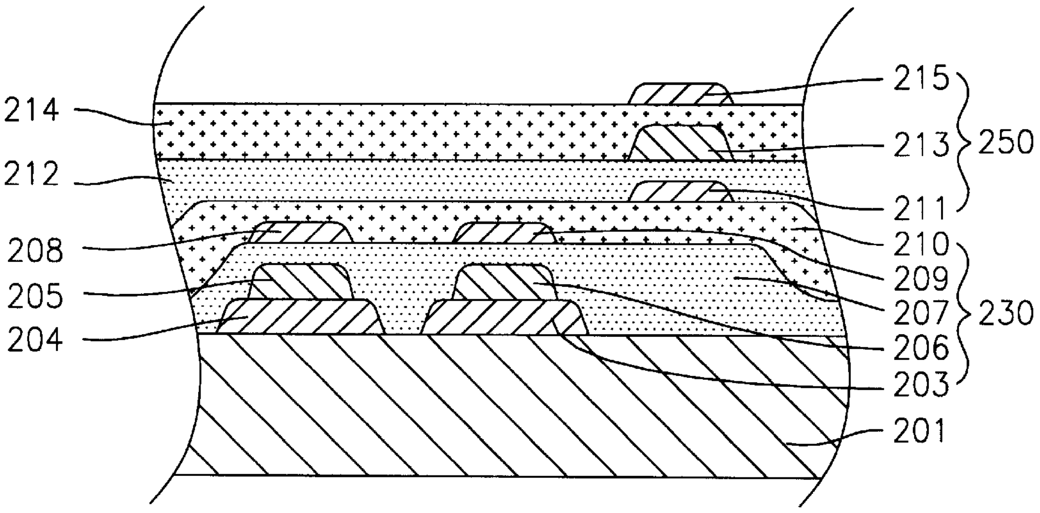

As set forth in FIG. 6D, the 15th electrode film 211, e.g., made of ITO is formed by using, e.g., an electron-beam evaporation method. The red light emitting thin-film EL layer 213, e.g., made of CaS:Eu is formed by using, e.g., an electron-beam evaporation method.

The 14th insulation film 214, e.g., made of $Y_2O_3$ is formed by using, e.g., an electron-beam evaporation method; and the 16th electrode film 215, e.g., made of ITO, is formed by using, e.g., an electron-beam evaporation method.

It should be noted that the center points of the 15th electrode film 211, the red light emitting thin-film EL layer 213 and the 16th electrode film 215 are aligned along an approximately same straight line.

In general, the thin-film EL layered structure 250 usually further includes a protection layer 216 made of, e.g., either parylene or glass, wherein the protection layer 216 is formed on top of the 16th electrode film 215 and partially on top of the 14th insulation film 214.

It should be noted that if the green light emitting thick-film EL layer 206 is made of ZnS:Cu, the atomic percent concentration of Cu in the green light emitting thick-film EL layer 206 is set to be lower than that in the blue light emitting thick-film EL layer 205.

In detail, in accordance with a preferred embodiment of the present invention, a blue light of a commercially acceptable brightness level from the blue light emitting thick-film EL layer 205 is obtained by applying an AC voltage with a frequency of about 1 KHz between the electrode films 204 and 208.

In contrast, to obtain a green light of a commercially acceptable brightness level from the green light emitting thick-film EL layer 206, an AC voltage with a frequency of about 400 Hz is applied between the electrode films 203 and 209 under the condition that the atomic percent concentration of Cu in the green light emitting thick-film EL layer 206 is lower than that in the blue light emitting thick-film EL layer 205.

Figure 3:
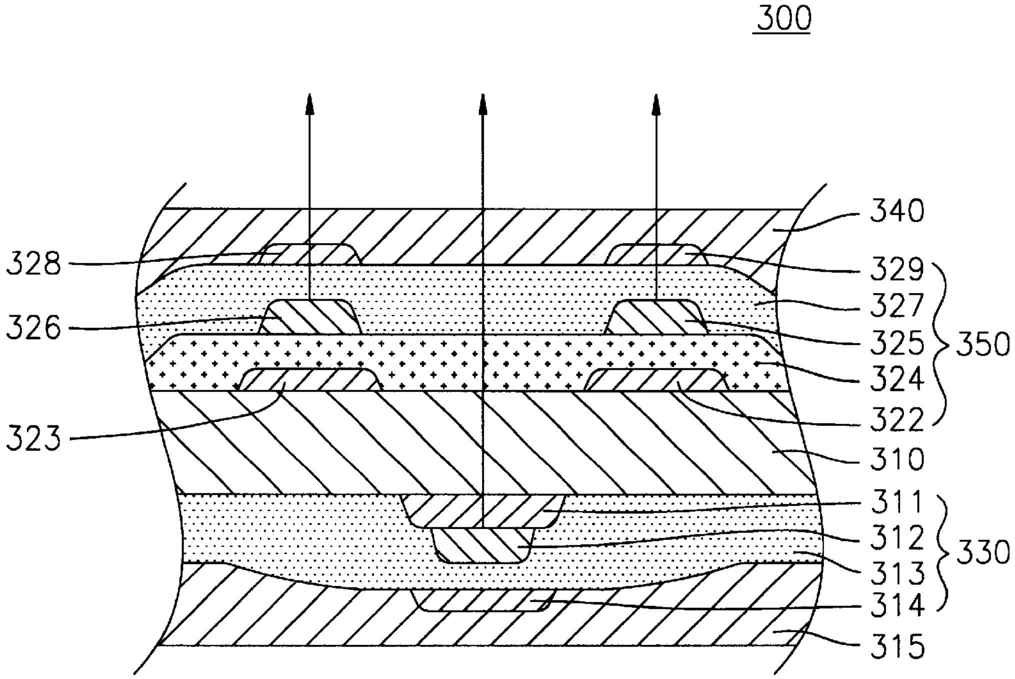
FIG. 3 illustrates a schematic cross sectional view of a full-color EL device in accordance with a third preferred embodiment of the present invention.

FIG. 3 illustrates a schematic cross sectional view of the full-color EL device 300 in accordance with a third preferred embodiment of the present invention.

Referring to FIG. 3, the full-color EL device 300 includes a substrate 310, e.g., made of glass; a thick-film EL layered structure 330 formed on bottom of the substrate 310, the thick-film EL layered structure 330 including a blue light emitting thick-film EL layer 312 to generate a blue light; a thin-film EL layered structure 350 formed on top of the substrate 310, the thin-film EL layered structure 350 including a red light emitting thin-film EL layer 325 to generate a red light and a green light emitting thin-film EL layer 326 to generate a green light.

In detail, the thick-film EL layered structure 330 includes a 21st electrode film 311 formed on bottom of the substrate 310; the blue light emitting thick-film EL layer 312 formed on bottom of the 21st electrode film 311; a 21st insulation film 313 formed on bottom of the blue light emitting thick-film EL layer 312, partially on bottoms of the 21st electrode film 311 and the substrate 310; and a 22nd electrode film 314 formed on bottom of the 21st insulation film 313.

It should be noted that the center points of the 21st electrode film 311, the blue light emitting thick-film EL layer 312 and the 22nd electrode film 314 are aligned perpendicularly.

In general, the thick-film EL layered structure 330 further includes a protection layer 315, e.g., made of parylene, formed on bottom of the 22nd electrode film 314 and partially on bottom of the 21st insulation film 313.

The thin-film EL layered structure 350 includes a 23rd electrode film 322 and a 24th electrode film 323, the 23rd and 24th electrode film 322 and 323 being separated from each other and formed on top of the substrate 310; a 23rd insulation film 324 formed on tops of the 23rd and 24th electrode film's 322 and 323 and partially on top of the substrate 310; the red light emitting thin-film EL layer 325 and a green light emitting thin-film EL layer 326, the red light emitting thin-film EL layer 325 and the green light emitting thin-film EL layer 326 being separated from each other and formed on top of the 23rd insulation film 324; a 24th insulation film 327 formed on tops of the red light emitting thin-film EL layer 325 and the green light emitting thin-film EL layer 326 and partially on top of the 23rd insulation film 324.

The thin-film EL layered structure 350 further includes a 25th electrode film 328 and a 26th electrode film 329, the 25th and 26th electrode films 328 and 329 being separated from each other and formed on top of the 24th insulation film 327.

It should be noted that the center points of the 24th electrode film 323, the green light emitting thin-film EL layer 326 and the 25th electrode film 328 are aligned perpendicularly; and the 23rd electrode film 322, the red light emitting thin-film EL layer 325 and the 26th electrode film 329 are also perpendicularly aligned.

In general, the thin-film EL layered structure 350 usually further includes a protection layer 340, e.g., made of parylene, wherein the protection layer 340 is formed on tops of the 25th electrode film 328 and the 26th electrode film 329 and partially on top of the 24th insulation film 327.

Figure 4:
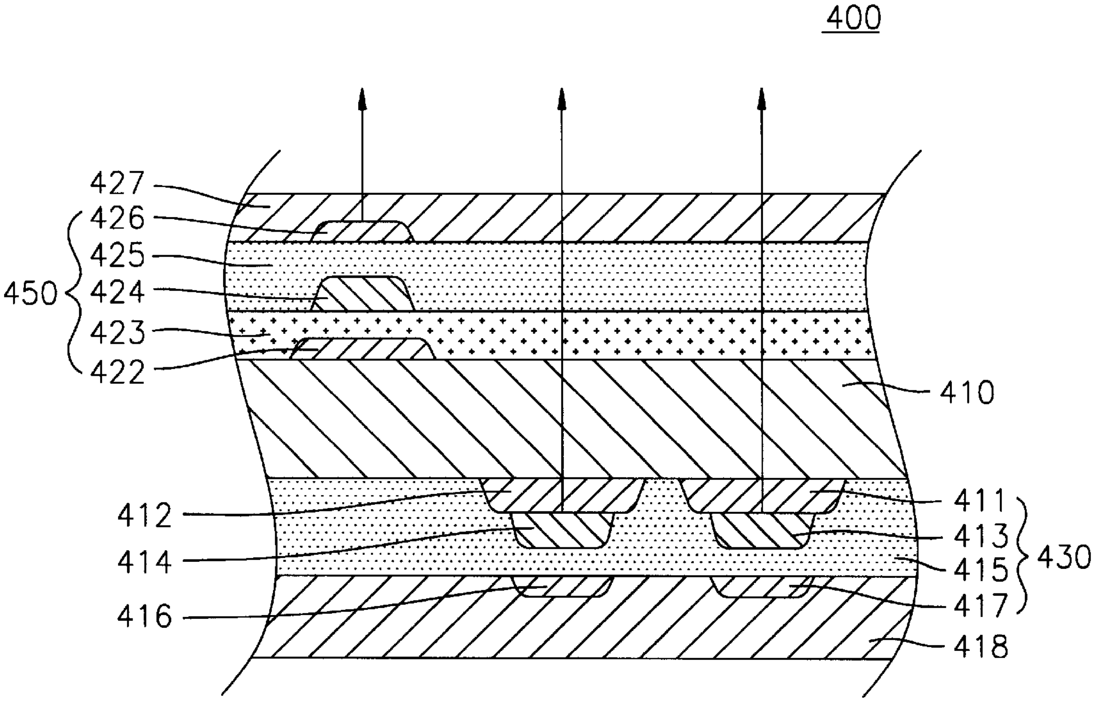
FIG. 4 depicts a schematic cross sectional view of a full-color EL device in accordance with a fourth preferred embodiment of the present invention.

FIG. 4 depicts a schematic cross sectional view of the full-color EL device 400 in accordance with a fourth preferred embodiment of the present invention.

Referring to FIG. 4, the full-color EL device 400 includes a substrate 410, e.g., made of glass; a thick-film EL layered structure 430 including a blue light emitting thick-film EL layer 413 to generate a blue light and a green light emitting thick-film EL layer 414 to generate a green light, wherein the thick-film EL layered structure 430 is formed on bottom of the substrate 410; and a thin-film EL layered structure 450 formed on top of the substrate 410 including a red light emitting thin-film EL layer 424 to generate a red light.

In detail, the thick-film EL layered structure 430 includes a 31st electrode film 411 and a 32nd electrode film 412, the 31st and 32nd electrode films 411 and 412 being separated from each other and formed on bottom of the substrate 410; the blue light emitting thick-film EL layer 413 formed on bottom of the 31st electrode film 411; and a green light emitting thick-film EL layer 414 formed on bottom of the 32nd electrode film 412.

The thick-film EL layered structure 450 further includes a 31st insulation film 415 formed partially on bottoms of the 31st electrode film 411, the 32nd electrode film 412 and the substrate 450 and on bottoms of the blue light emitting thick-film EL layer 413 and the green light emitting thick-film EL layer 414; and a 33rd electrode film 416 and a 34th electrode film 417, the 33rd and 34th electrode films 417 being separated from each other and formed on bottom of the 31st insulation film 415.

It should be noted that the center points of the 31st electrode film 411, the blue light emitting thick-film EL layer 413 and the 34th electrode film 417 are aligned perpendicularly; and the center points of the 32nd electrode film 412, the green light emitting thick-film EL layer 414 and the 33rd electrode film 416 are also aligned perpendicularly.

In general, the thick-film EL layered structure 430 further includes a protection layer 418, e.g., made of parylene, formed on bottom of the 33rd and 34th electrode films 416 and 417 and partially on bottom of the 31st insulation film 415.

The thin-film EL layered structure 450 includes a 35th electrode film 422 formed on top of the substrate 410; a 33rd insulation film 423 formed on top of the 35th electrode film 422 and partially on top of the substrate 410; the red light emitting thin-film EL layer 424 formed on top of the 33rd insulation film 423; a 34th insulation film 425 formed on top of the red light emitting thin-film EL layer 424 and partially on top of the 33rd insulation film 423; and a 36th electrode film 426 formed on top of the 34th insulation film 425.

It should be noted that the center points of the 35th electrode film 422, the red light emitting thin-film EL layer 424 and the 36th electrode film 426 are aligned perpendicularly.

In general, the thin-film EL layered structure 450 further includes a protection layer 427, e.g., made of parylene, wherein the protection layer 427 is formed on top of the 36th electrode film 426 and partially on top of the 34th insulation film 425.

It should be noted that the films or layers included in each of the thick-film EL layered structure's 230, 330 and 430 have almost equal thickness to the corresponding films or layers in the thick-film EL layered structure 130, respectively; the films or layers included in each of the thin-film EL layered structure's 250, 350 and 450 have almost equal thickness to the corresponding films or layers in the thin-film EL layered structure 150, respectively.

For the sake of simplicity, the description of the methods for manufacturing the thick-film EL layered structure 330 and the thin-film EL layered structure 350 are omitted since the methods therefor are similar to those of the thick-film EL layered structure 130 and the thin-film EL layered structure 150, respectively.

The description of the methods for the manufacturing the thick-film EL layered structure 430 and the thin-film EL layered structure 450 are also omitted since the methods therefor are similar to those of the thick-film EL layered structure 130 and the thin-film EL layered structure 150, respectively.

Further, as represented by arrows in FIGS. 1–4, it is preferable that three main paths of red, green and blue light beams from the corresponding EL layers in each of the EL devices 100, 200, 300 and 400 are not overlapped with each other to thereby enable each of the EL devices to emit a light of a commercially acceptable brightness level and be easily controlled by an electrode control circuit (not shown) therefor.

For example, as shown in FIG. 1, the blue light emitting thick-film EL layer 104 is located between the green light emitting thin-film EL layer 114 and the red light emitting thin-film EL layer 115; and as shown in FIG. 3, the blue light emitting thick-film EL layer 312 is located between the red light emitting thin-film EL layer 325 the green light emitting thin-film EL layer 326.

The red light emitting thin-film EL layer 213 is located either left or right of all of the blue light emitting thick-film EL layer 205 and the green light emitting thick-film EL layer 206; and the red light emitting thin-film EL layer 424 is located either left or right of all of the green light emitting thick-film EL layer 414 and the blue light emitting thick-film EL layer 413.

It should be noted that in accordance with another preferred embodiment of the present invention, the red light emitting thin-film EL layer 213 is located between the blue light emitting thick-film EL layer 205 and the green light emitting thick-film EL layer 206; and the red light emitting thin-film EL layer 424 is located between the green light emitting thick-film EL layer 414 and the blue light emitting thick-film EL layer 413.

Even though the three main paths of red, green and blue light beams from the corresponding EL layers included in each of the EL devices 100, 200, 300 and 400 are directed upward, respectively, as shown in FIGS. 1–4, it should be noted that in accordance with other preferred embodiments, the three main paths can also be directed downward, respectively.

It should be also noted that each of the insulation films and electrode films included in each EL device of the present invention should be transparent in case that the corresponding light beam passes therethrough and be either opaque or transparent in case that the corresponding light beam does not pass therethrough.

As described above, in accordance with the present invention, there is provided an EL device including a red light emitting thin-film EL layer, a blue light emitting thick-film EL layer and a green light emitting EL layer either as a green light emitting thin-film EL layer or as a green light emitting thick-film EL layer, thereby allowing the inventive EL device to display a full-color image of a commercially acceptable brightness level.

While the present invention has been described with respect to certain preferred embodiments only, other modifications and variations may be made without departing from the spirit and scope of the present invention as set forth in the following claims.

What is claimed is:

1. An electroluminescent (EL) device comprising:

a substrate;

a thick-film EL layered structure formed on top of the substrate; and a thin-film EL layered structure formed on top of the thick-film EL layered structure, wherein the thick-film EL layered structure includes a blue light emitting thick-film EL layer; and the thin-film EL layered structure includes a red light emitting thin-film EL layer and a green light emitting thin-film EL layer.

2. The EL device according to claim 1, wherein the thick-film EL layered structure includes:

a first electrode film formed on top of the substrate;

a first insulation film formed on top of the first electrode film and partially on top of the substrate;

the blue light emitting thick-film EL layer formed on top of the first insulation film;

a second electrode film formed on top of the blue light emitting thick-film EL layer; and a second insulation film formed on top of the second electrode film, partially on tops of the blue light emitting thick-film EL layer and the first insulation film.

3. The EL device according to claim 2, wherein the thin-film EL layered structure includes:

a third electrode film and a fourth electrode film, the third and fourth electrode films being separated from each other and formed on top of the second insulation film;

a third insulation film formed on tops of the third and fourth electrode films and partially on top of the second insulation film;

the red light emitting thin-film EL layer and the green light emitting thin-film EL layer, the red light emitting thin-film EL layer and the green light emitting thin-film EL layer being separated from each other and formed on top of the third insulation film;

a fourth insulation film formed on top of the green light emitting thin-film EL layer and the red light emitting thin-film EL layer and partially on top of the third insulation film; and a fifth electrode film and a sixth electrode film, the fifth and sixth electrode films being separated from each other and formed on top of the fourth insulation film.

4. The EL device according to claim 3, wherein the blue light emitting thick-film EL layer is made by employing either a spray coating method or a screen printing method; and the red light emitting thin-film EL layer is made by employing one of a sputtering method, an electron-beam evaporation method and an atomic layer epitaxy growth method.

5. The EL device according to claim 4, wherein the blue light emitting thick-film EL layer is made of ZnS:Cu; the green light emitting thin-film EL layer is made ZnS:Tb; and the red light emitting thin-film EL layer is made of CaS:Eu.

6. The EL device according to claim 5, wherein each of the insulation films and electrode films is transparent in case that the corresponding light beam passes therethrough.

7. The EL device according to claim 6, wherein the blue light emitting thick-film EL layer is located between the red light emitting thin-film EL layer and the green light emitting thin-film EL layer.

8. An electroluminescent (EL) device comprising:

a substrate;

a thick-film EL layered structure formed on top of the substrate; and a thin-film EL layered structure formed on top of the thick-film EL layered structure, wherein the thick-film EL layered structure includes a blue light emitting thick-film EL layer and a green light emitting thick-film EL layer; and the thin-film EL layered structure includes a red light emitting thin-film EL layer.

9. The EL device according to claim 8, wherein the thick-film EL layered structure includes:

a first electrode film and a second electrode film, the first and second electrode films being separated from each other and formed on top of the substrate;

the blue light emitting thick-film EL layer formed on top of the second electrode film;

the green light emitting thick-film EL layer formed on top of the first electrode film;

a first insulation film formed partially on top of the substrate and the first and second electrode films and top of the blue light emitting thick-film EL layer and the green light emitting thick-film EL layer;

a third electrode film and a fourth electrode film, the third and fourth electrode films being separated from each other and formed on top of the first insulation film; and a second insulation film formed on top of the third and fourth electrode films and partially on top of the first insulation film.

10. The EL device according to claim 9, wherein the thin-film EL layered structure includes:

a fifth electrode film formed on top of the second insulation film;

a third insulation film formed on top of the fifth electrode film and partially on top of the second insulation film;

the red light emitting thin-film EL layer formed on top of the third insulation film;

a fourth insulation film formed on top of the red light emitting thin-film EL layer and partially on top of the third insulation film; and a sixth electrode film formed on top of the fourth insulation film.

11. The EL device according to claim 10, wherein the red light emitting thin-film EL layer is made of CaS:Cu; the blue light emitting thick-film EL layer is made of ZnS:Cu; and the green light emitting thick-film EL layer is made of one of ZnS:Tb, ZnS:Cu and ZnS:Mn.

12. The EL device according to claim 11, wherein the red light emitting thin-film EL layer is located either between the green light emitting thick-film EL layer and the blue light emitting thick-film EL layer or either left or right of all of the green light emitting thick-film EL layer and the blue light emitting thick-film EL layer.

13. An electroluminescent (EL) device comprising:

a substrate;

a thick-film EL layered structure formed on bottom of the substrate; and a thin-film EL layered structure formed on top of the substrate, wherein the thick-film EL layered structure includes a blue light emitting thick-film EL layer; and the thin-film EL layered structure includes a red light emitting thin-film EL layer.

14. The EL device according to claim 13, wherein the blue light emitting thick-film EL layer is made of ZnS:Cu; the green light emitting thin-film EL layer is made ZnS:Tb; and the red light emitting thin-film EL layer is made of CaS:Eu.

15. The EL device according to claim 14, wherein the thick-film EL layered structure includes:

a first electrode film formed on bottom of the substrate;

the blue light emitting thick-film EL layer formed on bottom of the first electrode film;

a first insulation film formed on top of the blue light emitting thick-film EL layer and partially on top of the first electrode film and the substrate; and a second electrode film formed on top of the first insulation film.

16. The EL device according to claim 15, wherein the thin-film EL layered structure includes:

a third electrode film and a fourth electrode film, the third and fourth electrode films being separated from each other and formed on top of the substrate;

a third insulation film formed on top of the transparent third and fourth electrode film's and partially on top of the substrate;

the red light emitting thin-film EL layer and the green light emitting thin-film EL layer, the red light emitting thin-film EL layer and the green light emitting thin-film EL layer being separated from each other formed on top of the third insulation film;

a fourth insulation film formed on top of the red light emitting thin-film EL layer and the green light emitting thin-film EL layer and partially on top of the third insulation film; and a fifth electrode film and a sixth electrode film, the fifth and sixth electrode films being separated from each other and formed on top of the fourth insulation film.

17. An electroluminescent (EL) device comprising:

a substrate;

a thick-film EL layered structure formed on bottom of the substrate; and a thin-film EL layered structure formed on top of the substrate, wherein the thick-film EL layered structure includes a blue light emitting thick-film EL layer and a green light emitting thick-film EL layer; and the thin-film EL layered structure includes a red light emitting thin-film EL layer.

18. The EL device according to claim 17, wherein the red light emitting thin-film EL layer is made of CaS:Cu; the blue light emitting thick-film EL layer is made of ZnS:Cu; and the green light emitting thick-film EL layer is made of one of ZnS:Tb, ZnS:Cu and ZnS:Mn.

19. The EL device according to claim 18, wherein the thick-film EL layered structure includes:

a first electrode film and a second electrode film, the first and second electrode films being separated from each other and formed on bottom of the substrate;

the blue light emitting thick-film EL layer formed on bottom of the first electrode film;

the green light emitting thick-film EL layer formed on bottom of the second electrode film;

a first insulation film formed partially on bottom of the first electrode film, the second electrode film and the substrate and on bottom of the blue light emitting thick-film EL layer and the green light emitting thick-film EL layer; and a third electrode film and a fourth electrode film, the third and fourth electrode films being separated from each other and formed on bottom of the first insulation film.

20. The EL device according to claim 19, wherein the thin-film EL layered structure includes:

a fifth electrode film formed on top of the substrate;

a third insulation film formed on top of the fifth electrode film and partially on top of the substrate;

the red light emitting thin-film EL layer formed on top of the third insulation film;

a fourth insulation film formed on top of the red light emitting thin-film EL layer and partially on top of the third insulation film; and a sixth electrode film formed on top of the fourth insulation film.

* * * * *

UNITED STATES PATENT AND TRADEMARK OFFICE
CERTIFICATE OF CORRECTION

PATENT NO. : 6,211,538 B1
DATED : April 3, 2001
INVENTOR(S) : Y.K Park

It is certified that error appears in the above-identified patent and that said Letters Patent is hereby corrected as shown below:

<u>Title page,</u>
Item [73], Assignee, please add the second assignee:
-- CND CO., LTD. KYUNGGI-DO (KR) --

Signed and Sealed this

Sixth Day of April, 2004

JON W. DUDAS
*Acting Director of the United States Patent and Trademark Office*

UNITED STATES PATENT AND TRADEMARK OFFICE

CERTIFICATE OF CORRECTION

PATENT NO. : 6,211,538 B1
DATED : April 3, 2001
INVENTOR(S) : Y.K. Park

It is certified that error appears in the above-identified patent and that said Letters Patent is hereby corrected as shown below:

Title page,
Item [73], Assignee, please insert -- Korea Electronics Technology Institute, Kyunggi-Do (KR) and CND Co., Ltd., Kyunggi-Do (KR) --

Signed and Sealed this

Fifth Day of October, 2004

JON W. DUDAS
*Director of the United States Patent and Trademark Office*